United States Patent [19]
Smith, Jr.

[11] Patent Number: 4,824,005
[45] Date of Patent: Apr. 25, 1989

[54] DUAL MODE ULTRASONIC GENERATOR IN A WIRE BONDING APPARATUS

[75] Inventor: Hal W. Smith, Jr., Costa Mesa, Calif.

[73] Assignee: Orthodyne Electronics Corporation, Costa Mesa, Calif.

[21] Appl. No.: 899,043

[22] Filed: Aug. 13, 1986

[51] Int. Cl.$^4$ ............................................. B23K 1/06
[52] U.S. Cl. .................... 228/1.1; 228/110; 228/4.5; 228/102; 228/8
[58] Field of Search ............ 228/1.1, 110, 4.5, 7, 228/8, 102

[56] References Cited

U.S. PATENT DOCUMENTS

| | | | |
|---|---|---|---|
| 3,302,277 | 2/1967 | Pruden et al. | 228/1.1 X |
| 3,784,079 | 1/1974 | Spanjer | 228/1.1 |
| 3,794,236 | 2/1974 | Salzer et al. | 228/1.1 |
| 4,341,574 | 7/1982 | Landes | 228/1.1 X |
| 4,409,659 | 10/1983 | Devine | 228/1.1 X |
| 4,438,880 | 3/1984 | Smith et al. | 228/1.1 |
| 4,571,688 | 2/1986 | Kashihara et al. | 228/110 X |
| 4,597,519 | 7/1986 | Kurtz et al. | 228/110 X |
| 4,603,802 | 8/1986 | Kurtz et al. | 228/102 X |
| 4,606,490 | 8/1986 | Chan et al. | 228/110 X |
| 4,696,425 | 9/1987 | Landes | 228/1.1 |

*Primary Examiner*—Nicholas P. Godici
*Assistant Examiner*—Carmine Cuda
*Attorney, Agent, or Firm*—George F. Bethel; Patience K. Bethel

[57] ABSTRACT

The specification sets forth an ultrasonic wire bonding system for bonding wire to an underlying electronic circuit or terminal. The system incorporates a bonding tool connected to a transducer which causes the bonding tool to ultrasonically vibrate and when impressed against a wire lying thereunder, bond said wire to an underlying electronic circuit. The transducer is driven by a generator which generates either a constant current or constant voltage to the transducer while it is bonding. The constant current mode accommodates thick films and stitch bonding which require substantially more force, while the constant voltage mode provides for thin films and ball bonding which requires substantially less ultrasonic force. As a consequence, the generator provides for the foregoing dual mode so as to optimize the bonding characteristics between the two respective bonds that are provided by this invention and is controlled by a host computer, a digital to analog converter (DAC) and a phase detector connected to a reactance modulator with a limiter and a synchronous detector through a power amplifier to a respective transducer that is to be driven in either the constant current or constant voltage mode.

9 Claims, 5 Drawing Sheets

DUAL MODE ULTRASONIC GENERATOR IN A WIRE BONDING APPARATUS

FIELD OF THE INVENTION

The field of this invention resides within the wire bonding art. In particular, it lies within the ultrasonic wire bonding art wherein wires are ultrasonically bonded to an underlayment. More particularly, it resides within the electronic wire bonding art wherein an electronic device such as an integrated or hybrid circuit has a wire bonded to it.

THE PRIOR ART

The prior art of ultrasonic wire bonding has incorporated wire bonders which are provided with a transducer. The transducer converts electrical energy into ultrasonic vibratory motion. Attached to the transducer is a wire bonding tool which receives the ultrasonic energy.

The ultrasonic energy transmitted to the bonding tool is then transmitted to the work which comprises a wire that is to be bonded to an underlying material such as a semiconductor or a semiconductor terminal.

The movement of the wire bonding tool is an extremely critical factor in making ultrasonic bonds. If the movement of the tool is insufficient, no bonding will occur. If the movement of the tool is excessive, the bond and/or underlying surface may be damaged.

In the past, such bonders have suffered from relatively narrow ranges of acceptable bonding parameters. The main parameters are the time period of the bond, the vibrational amplitude of the bonding tool and the static load of the bonding tool against the wire. In effect, the electromechanical conditions necessary for optimizing the bond under a wide variety of surface conditions are difficult because of the foregoing constraints of bond time, amplitude of the wire bonding tool and the static load of the tool against the wire.

In general, the most delicate bonds are those on thin films of metalization. These thin films of metalization are usually on the semiconductor device itself. In many cases, the films are no more than one micron thick. Too much energy applied to the bond can easily damage the thin film underlying the bond.

In contrast to semiconductor device thin films, hybrid circuits are often mde by silkscreening metallic pastes onto a ceramic plate and subsequently firing the paste. These paste conductor patterns thus become primarily metallic in nature in many ways similar to the etched copper traces on printed circuitboards. The thick film traces are often twenty-five or more microns thick. Bonding to the thin films requires different operating conditions (i.e. the time of the bond, the power and the static load) than those required for bonds on the foregoing thick film circuits. This is due to the fact that the relationship of the interface between the bonding tool and in particular, the wire that is being bonded and the underlying thin or thick film, creates different conditions with respect to the bonding tool's operation.

In addition to the foregoing differences, there are different bonding techniques with respect to first and second bonds made by a ball bonding machine. The first bond generally is made by pressing a ball formed on the end of a wire against the circuit that it is to be bonded to. Force is then applied to the ball that has been formed while ultrasonic energy then causes the ball to be bonded to the underlying surface. It has been found that the expanding contact area of the ball tends to shear the surface contaminants from the bond area. This exposes fresh metal on both sides of the interface of the bond with the ball. The bond is formed at this interface.

In conjunction with the first ball bond, a second bond or stitch bond is often formed in connected relationship to the wire to which the ball is connected. There is no ball in this particular bond, but merely a placement of a wire under the bonding tool. The wire is pressed against the work surface with substantially more force than was used for the ball bond and ultrasonic energy is applied to the transducer and wire thereunder.

By way of example, when a 0.001 inch wire is bonded, the bond force is typically 25 grams at the ball portion and 140 graams at the stitch bond. Thus, as can be seen, even when one wire is bonded by means of a ball bond and is then stitch bonded to another portion, there is a substantial variance with regard to the load applied to the tool. The much greater load applied to the stitch bond process more completely clamps the tool, damping the ultrasonic vibration.

Simply raising the voltage on the transducer results in erratic bonding as the damping of the bonding tool changes during the formation of the bond. If the voltage had been raised to compensate for damping that occurs during the final stages of bond formation, the tool motion would be excessive during the early stages of formation when the damping is much less.

This invention overcomes the problems of the prior art by allowing for suitable bonding energy at the bonding tool for different types of bonds. It can be varied with respect to a wire that is to be bonded from one type of surface to another. When a substantially thick, spongy material is to be bonded, which thereby tends to damp the bonding tool, or high static loads on the bonding tool are required such as with regard to stitch bonding, the generator and attendant power output of this invention provides for an improved bond. This is due to the fact that the generator provides for a constant current during the bonding operation for those operations which require large amounts of energy. These bonds take place with stitch bonds that are under heavy static loads and with respect to those bonds that are being effectuated with regard to substantially thick film.

On the other hand, when wires are to be bonded to very thin films or low static loads are required, this invention provides for the right amount of power by providing constant voltage to the transducer. This permits transducer current and thus amplitude to vary as a function of bond area.

With the foregoing in mind, it can be stated that this ultrasonic generator and transducer provides for reliable bonding between variable surfaces under various conditions.

SUMMARY OF THE INVENTION

In summation, this invention comprises an ultrasonic generator and transducer that can alternately bond to thick films and thin films and can operate with respect to various bonding times, amplitudes and static loads as required with regard to the bonding tool and the particular type of bond to be effectuated.

The ultrasonic generator and transducer are incorporated in a wire bonding apparatus which presses a wire bonding tool connected to the transducer onto a particular piece of work. The work generally comprises a wire that is to be bonded at one end to an underlying surface such as a film on a semiconductor. At the other end of the wire, a bond takes place with either a terminal or another portion of the circuit.

Variations in thickness of the material to which the wire is to be bonded to, whether it be between bonds connected by a single wire or multiple wires or various bonds on variably changing surfaces, is accommodated by this invention. Various loads on the wire bonding tool, amplitude of movement of the wire bonding tool and time of bond are accommodated by the movement of the transducer and attendant movement of the bonding tool. This is compensated for by utilizing a generator which can provide constant voltage for those bonds that are to take place under very light loading, or on thin films.

When large static loads on the wire are required, or when thick films are to be bonded to, this invention provides a constant current source to the bonding tool. The constant current source maintains bonding tool tip amplitude so that the tool is not damped by the required large static loads on the tool or the thick film damping the movement of the tool.

A superior bond results whether the tool requires a high static load, or less static load over a wider range of film thickness and hardness characteristics. The constant voltage or constant current effect that can be provided for driving the transducer and attendant bonding tool of this invention is an improvement over the prior art as to both the quality of bond and the flexibility of the bonding capability of this invention.

BRIEF DESCRIPTION OF THE DRAWINGS

The invention will be more clearly understood by reference to the description below taken in conjunction with the accompanying drawings wherein.

DESCRIPTION OF THE PREFERRED EMBODIMENTS

Figure 1:
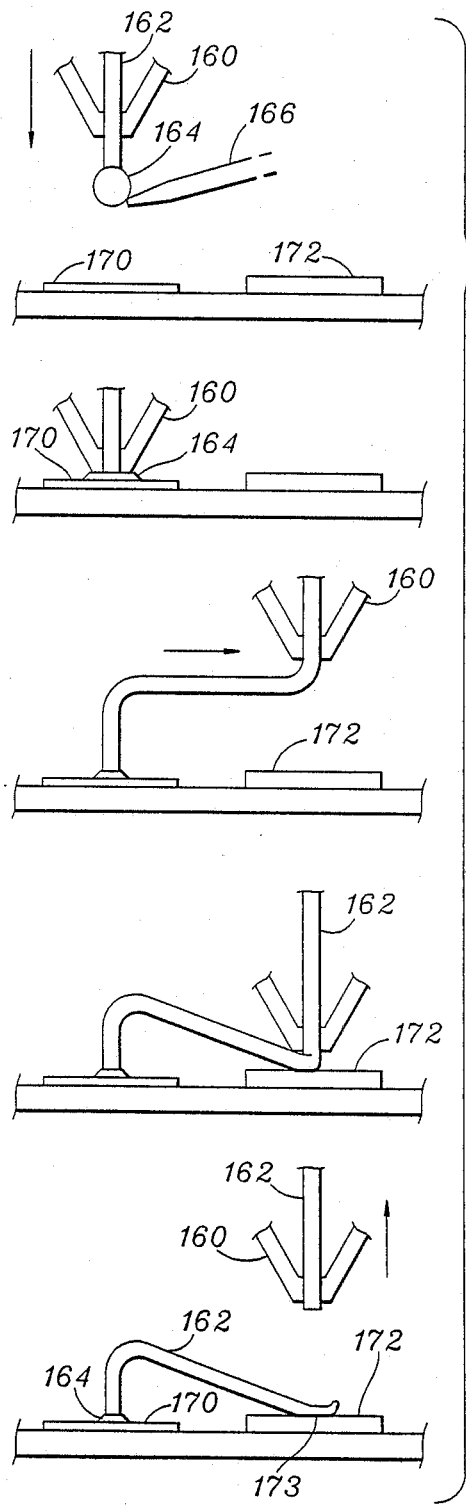
FIG. 1 shows a sequential side elevation stepped operation of bonding a ball bond to a thin film and a subsequent bonding of the wire to which the ball is attached to a thick film.
Figure 4:
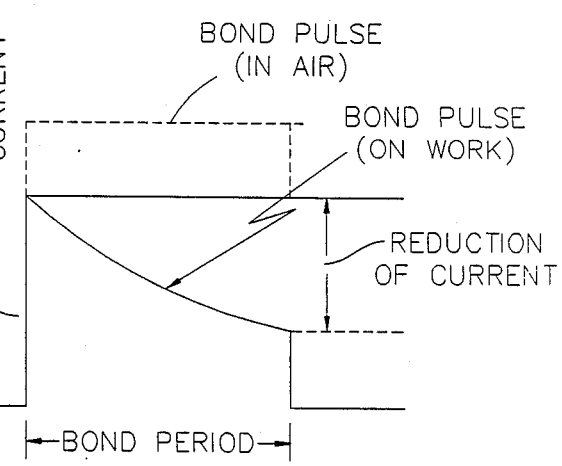
FIG. 4 shows a plot of the current against the bond period.

When looking at FIG. 1, it can be seen wherein a bonding tool is shown. In particular, a bonding tool 160 is shown having a wire 162 passing therethrough. The wire 162 is provided with a ball 164 at the end thereof. The ball has been formed by either a flame or a spark emanating from a ball forming means 166. The ball forming means 166 is well known in the art whereby it makes a ball 164 by flaming or sparking the end of the wire to the point where it forms a sphere.

This rounded end or ball 164 is moved downwardly as can be seen in the second step and impressed by the tool 160 against a work surface 170 of the underlying material. In particular, the work surface is a thin film 170 of a semiconductor material. The thin film 170 that it is to be bonded to is such wherein it is a relatively delicate material. If excessive vibrations take place, the surface of the material 170 can be significantly impaired. It is this delicacy that requires a particular bonding force as will be enunciated hereinafter.

After the bonding has taken place with the underlying material, the bonding tool 160 can be moved in the direction toward the right as seen so as to bond the wire to a thicker underlayment or thick film 172. The thicker underlayment or film 172 receives the head in its downwardly moving direction and causes the wire 162 to be bonded thereagainst by means of vibration with the heel or end of the tool 160 vibrating the wire 162 sufficiently to provide for an ultrasonic bond.

As can be appreciated, the ultrasonic bond between underlayment or thin film 170 and underlayment or thick film 172 are completely different. The characteristics required of the bonding of the two are such wherein the bond to the thicker material 172 requires substantially more energy. This can be due to the fact that the thick material 172 serves to provide a damping to the tool 160. As it moves back and forth, the thickness of the material envelopes so to speak the wire so that it sinks in more deeply, causing a greater degree of damping of the ultrasonic energy on the tool 160. In addition, the wire in the region of the stitch bond is flattened much more than the ball, to the point where an annular ring impression of the tool may be left in the surface 172.

Figure 2:
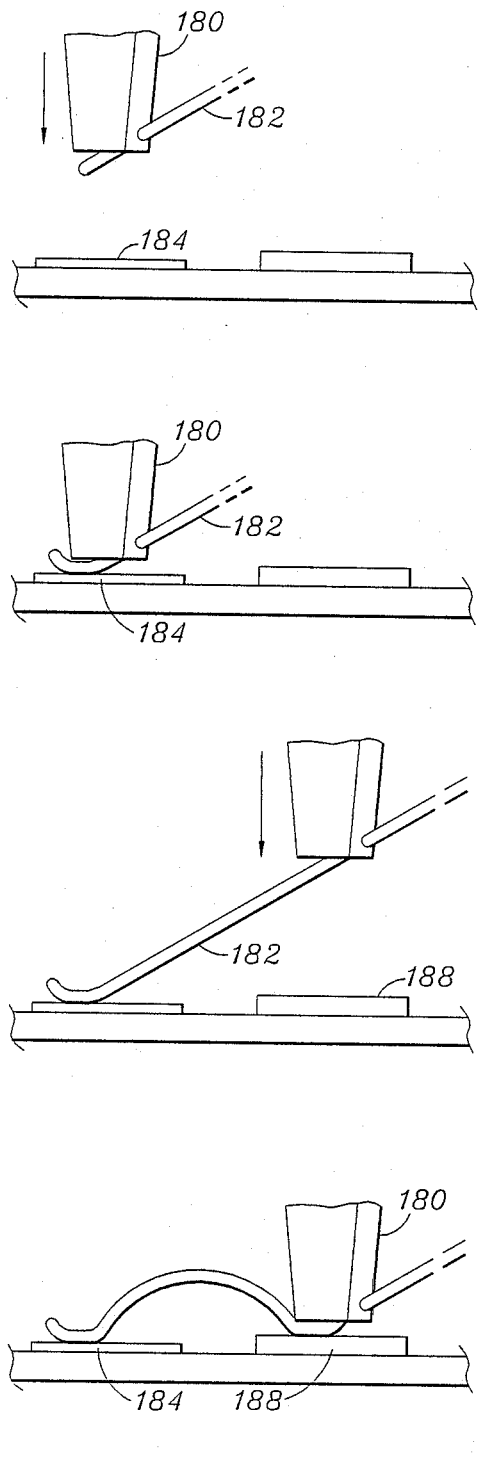
FIG. 2 shows a sequential bond that can be called a wedge bond that has been bonded to firstly a thin film and subsequently a thick film.

Looking more particularly at FIG. 2, it can be seen that a number of steps are shown with regard to wedge bonding by a tool 180 having an opening or wire feed hole passing therethrough. The hole receives a wire 182 that is to be bonded against an underlayment 184 of a semiconductor material. The material 184 is a thin film like the thin film 170 as shown in FIG. 21. The bonding tool 180 is lowered after which it ultrasonically bonds the wire 182 to the underlayment or thin film 184.

The bonding tool 180 then moves upward and to the right of the drawing after the bond has been made in order to bond the wire 182 to a thick film 188. The thick film 188 receives the bond substantially in the same manner as the thick film 172 in FIG. 1. However, in this particular case, underlayment 188 absorbs significantly more energy.

Figure 3:
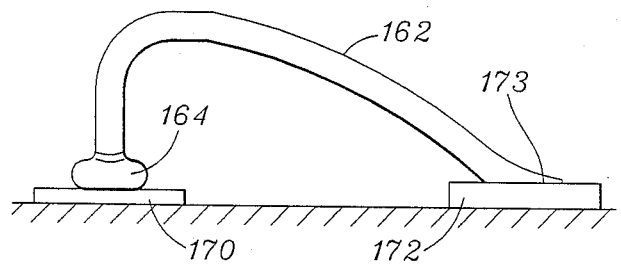
FIG. 3 shows a ball bond to a thin film attached to a wire that has then been bonded to a thick film by a stitch bond.

The end result of the bonding in FIG. 1 can be seen in some detail in FIG. 3. FIG. 3 shows the thin film 170 having the ball 164 bonded thereto and the wire 162 bridging over to a thick film 172 to which the stitched relationship of the ultrasonic bond has taken place at the stitch or bond 173.

In order to understand the bonding relationship and the operational requirements for this invention, it should be understood that a limited amount of power is necessary in order to bond to a thin film, such as the thin film 170. This is due to the fact that the thin film does not damp the bonding tool 160 and the attendant lateral ultrasonic force against the ball as significantly as the thick film 172. When a stitch bond is utilized, the downward clamping forces against the bond by the tool 160 are significantly greater. For instance, when a ball bond of the ball type 164 or a thin film bond of the type of thin film 170 is effectuated, the clamping force required is only about 25 grams. To the contrary, when the stitch bond is being made as shown with the bond being finalized as bond 173 and which can also be exemplified by the showing of FIG. 3, a total of 140 graams of clamping force is required. This being the case, the power and the static load are different. Furthermore, at some times the duration of the bond is different.

Figure 7:
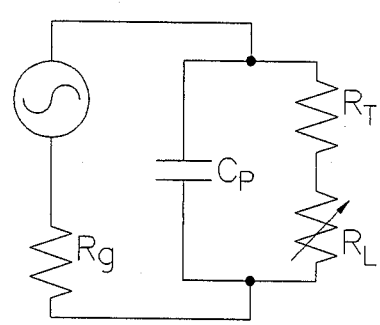
FIG. 7 shows a representation of the generator and the operation of the bonding apparatus reduced to its electronic equivalents.
Figure 8:
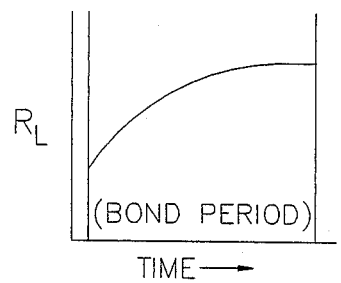
FIG. 8 shows a plot of the bond period against the resistance that is characterized by the typical load at the bonding tool.

In order to understand the foregoing phenomena as applied to a generator and an ultrasonic transducer that provides the wire bonding, the schematics of FIGS. 7 and 8 have been shown.

In particular, FIG. 7 shows a simplified schematic diagram of an ultrasonic generator and ultrasonic transducer used for wire bonding. When ball bonding, the internal impedance Rg of the generator is made small approaching a constant voltge source. The transducer shown is an electrostrictive type which has been drawn as a simplified circuit at resonance. All reactive elements except the parallel capacity Cp are balanced against each other. $R_t$ represents the internal losses of the transducer from all causes. $R_t$ is designed to be small compared to $R_1$. $R_1$ represents the load. In this case the load is the wire bond which absorbs most of the energy.

$R_1$ is shown as a variable resistor. This is due to the fact that as the energy is delivered to the load, it changes during the bond period as the wire deforms, creating a larger area in contact with the tool and work surface. As can be appreciated, $R_1$ would be zero if the transducer were energized in air because there is no damping or static force caused by the placement of the tool against a work surface.

$R_1$ in an actual ball bonding situation on one mil diameter wire could start as approximately thirty ohms at the beginning of the bond period and might eventually increase to two to three hundred ohms at the end of the bond period. The foregoing function is shown in FIG. 9 as an increase of $R_1$ during the bond period time.

The foregoing situation is nearly ideal for a ball bond. In effect, a flattening of the curve of the amplitude indicates that an equilibrium has been developed where energy absorbed by $R_1$ is insufficient to deform the wire bond any further. This is advantageous inasmuch as it suggests that the bond time beyond a minimum required to reach equilibrium is no longer a factor and will not deform the bond further. In effect, the bond is not destroyed nor deformed in greater measure by going beyond a prescribed minimum period of time. If a bond is continually being driven at high tool amplitude beyond a certain time period, it will deform the bond and may shear the bond from the metallization or underlying surface.

Looking more particularly at FIGS. 2 and 3, it can be seen wherein a stitch type bond is being made with regard to a thick film 172 or 188. If a stitch bond is made to a thick film, a much larger change in dynamic loading is encountered. This is due to the larger area of the bond and larger force used to reduce the wire cross section under the bonding tool and to the energy absorbed by the film in the vicinity of the tool impression in said film. As previously stated, static load on the tool against the wire is greater with regard to the stitch bond to the extent where it can be sometimes six times more.

The stitch bond benefits from a generator/transducer combination that operates as a more constant current system. In effect, the system should be one wherein the tool continues to vibrate ultrasonically even though the damping presented by the load is very large.

From the foregoing it can be seen that the requirements for a ball bond and stitch bond conflict with each other. As a consequence, in order to maintain strong bonding in a stitch bond, a general rule would be that constant current should be maintained. Furthermore, this is also generally true with regard to thick films, wherein a constant current should be maintained.

On the other hand, in those situations where thin film or ball bonding is utilized, a constant voltage should be maintained to eliminate the scrubbing through of the material and to enhance the operation of the bonder when a ball is being bonded.

The inventor has found that a dual mode generator which generates constant voltage to the transducer for ball bonds and thin film bonding and constant current for stitch bonds and thick film bonds, can effectuate this. The generator can be configured for either form of operation in this invention by using a separate control line to the generator from the system controller as exemplified from the showing of FIG. 6. FIG. 6 generally sets forth the dual mode generator of this invention in schematic form.

In operation, ultrasonic energy is produced by an oscillator, which in this example operates at 60 kHz. This energy is coupled to the transducer thorugh an output power amplifier, and an output transformer T-1. A sample of transducer current is detected and applied to the phase detector whose reference signal is the oscillator voltage.

The phase detector determines if there is a difference in phase between the transducer current and its voltage and unbalances the reactance modulator to correct the oscillator frequency in order to maintain the proper phase relationship at the transducer. Frequency shifting reactance components are continuously corrected during the bond cycle. This leaves the remaining current changes as purely resistive changes occurring as $R_1$, which is the change in resistance reflected due to the damping of the tool as described with respect to FIG. 7. As previously set forth, $R_1$ is the variable resistance during the bonding process.

The foregoing current changes are detected by an extremely sensitive synchronous detector which derives its synchronization signal from the oscillator. The output at point "A" is a DC level directly proportional to the amplitude of the tool. This level is summed and amplified with the DC level developed from the value supplied by a computer during constant current operation.

Figure 5:
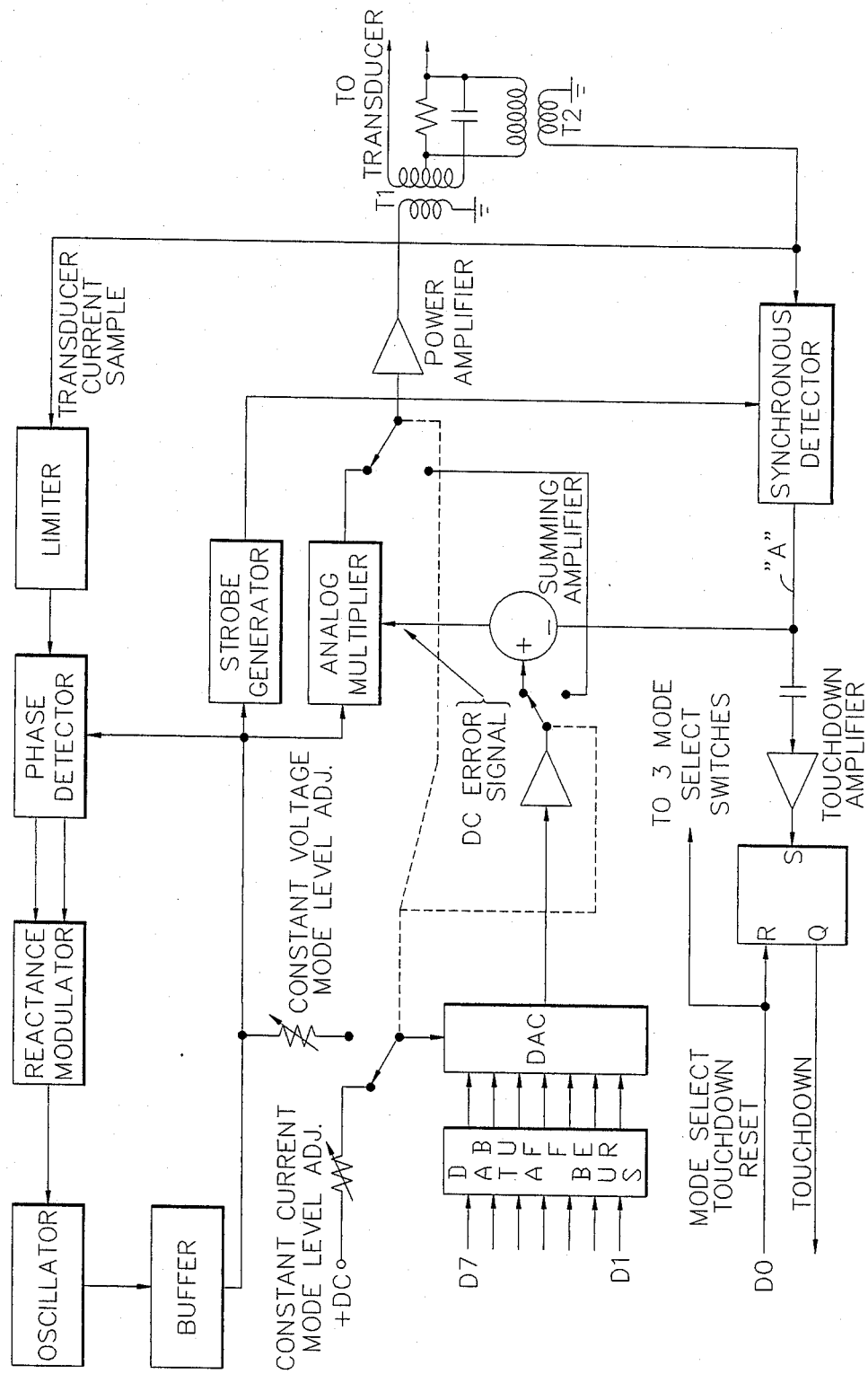
FIG. 5 shows a block diagram overview of the circuit of this invention.

The first mode for operation of constant current which applies power to the transducer for purposes of stitch bonding and heavy duty bonding to thick films is described generally and is facilitated in the switch configuration as shown in FIG. 5. In point of fact, the switches are not true switches but digital logic rather than mechanical switches. The showing in FIG. 5 is set at the constant current mode which will be described first.

The constant current at the transducer is provided by the oscillator signal being diverted to an analog multiplier. A digital to analog converter (DAC) references a DC level. The output of the DAC is a DC level directly proportional to the value of the data at the digital input. Please keep in mind that the digital input is provided from a host computer which is the computer that receives and derives the requirements of whether or not a constant current is required or a constant voltage is required at the transducer. The host computer also controls the amplitude, bonding time and the amount of static load seen at the bonding tool.

The computer program is established to be consistent with the types of bonds (ball or stitch) that are to be implemented for thick or thin films. During the operation, the computer provides the logic necessary to control the bonding.

The DC level is amplified and applied to a summing amplifier along with the transducer current signal proportional to the motion of the tip of the bonding tool. The motion of the tip of the bonding tool is derived from the synchronous detector.

The output of the summing amplifier is an error signal which modulates the 60 kHz signal applied to the power amplifier. In this manner, the amplitude of the 60 kHz signal from the oscillator is varied proportionally by the value on the data bus connected to the DAC. In addition thereto, it is instantaneously varied to maintain a constant output current in the transducer, even though the impedance of the transducer changes dramatically during the bonding operation, such as in the case of thick film circuits. Thus, as can be seen, the constant current system is eminently helpful in providing the constant current necessary to drive the bonding tool throughout the time of the bond.

When the constant voltage mode is to be utilized, which is the mode for purposes of providing a bond to a thin film or ball bonded wire, the switches as can be seen are switched from the constant current mode to the constant voltage mode. This is done by changing the logic level on the control line Do. This new level not only changes the switches to their alternate position for constant voltage; but, it also enables the touchdown sensor.

In the constant voltage mode, the amplitude of the oscillator signal to the power amplifier is controlled by a digital to analog converter (DAC) as previously set forth. The DAC input is set by the bonder's computer to any odd value between 0 and 255. The amplitude of the 60 kHz signal output from the DAC is a function of this data value. When the DAC's digital input (all data lines high) is 0, it turns the generator output off. When the value of the line is 255 (in effect all data lines are low), the data input produces the full amplitude of 60 kHz level of the output of the DAC.

The output of any intermediate digital value between 0 and 255 on the DAC's input, produces a corresponding change in the amplitude of the 60 kHz voltage at the output of the DAC. In this way, the value and duration of the ultrasonic pulse applied to the transducer is controlled by the host bonder's computer as previously set forth. No feedback is derived from the transducer for power correcting purposes. The transducer's output amplitude is purposely allowed to diminish during bonding to avoid damage to the bond. The foregoing provides for a constant voltage so that thin films are wire bonding with a ball bond are enhanced.

Figure 6A:
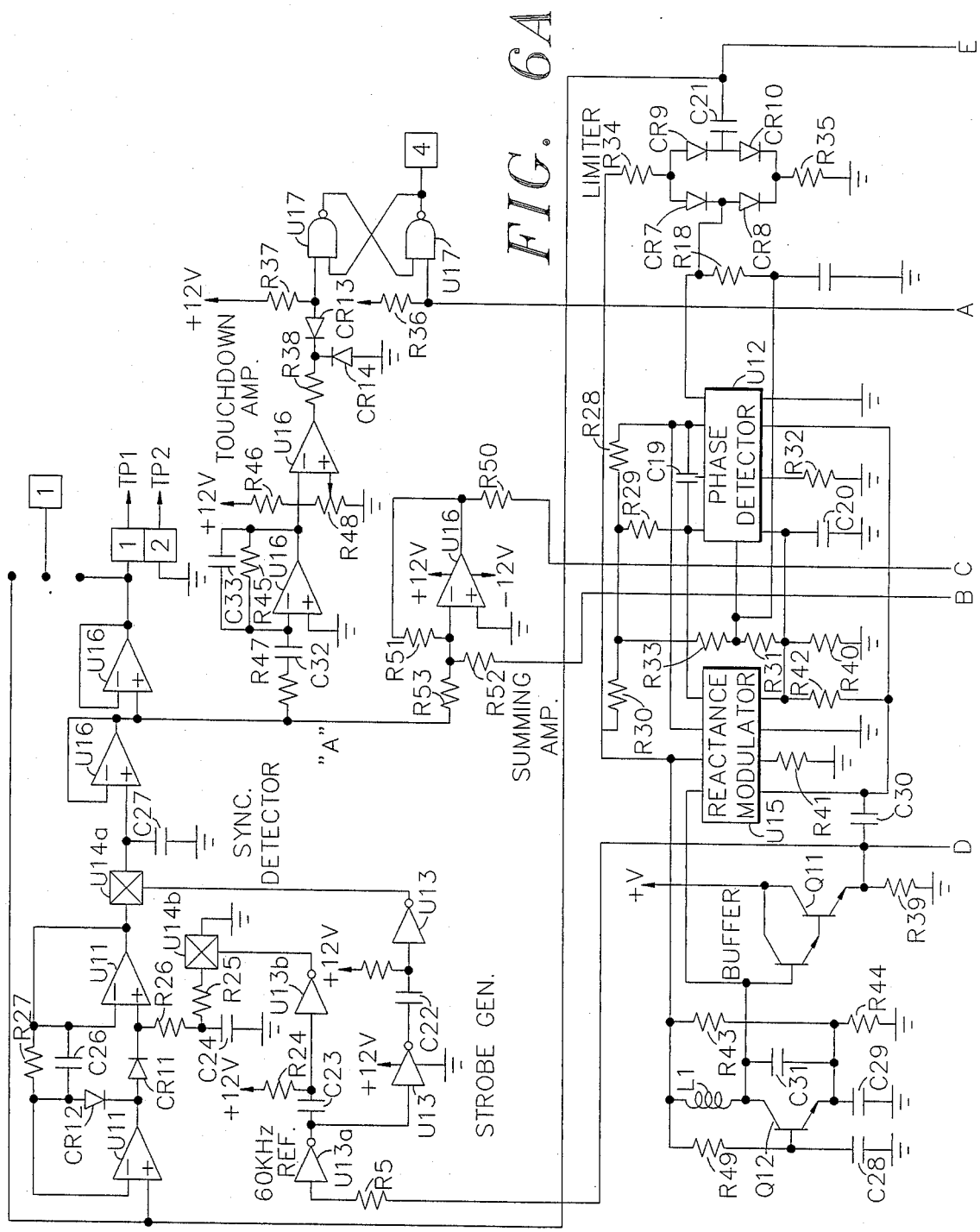
FIG. 6a shows a detailed circuit diagram of this invention.
Figure 6B:
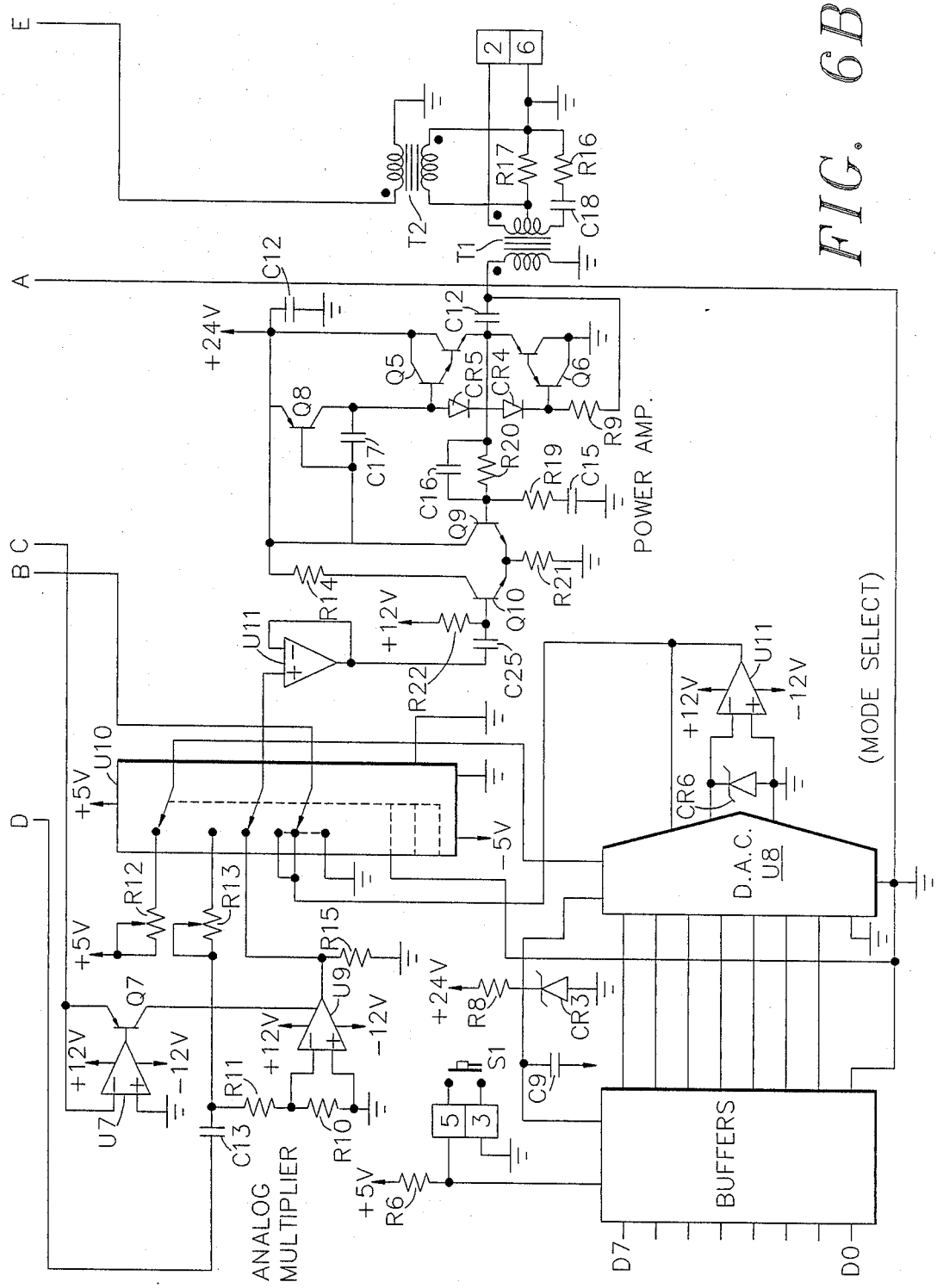
FIG. 6b shows a continuation of the circuit diagram of this invention.

Looking more particularly at the circuit details of FIGS. 6a and 6b, it can be seen wherein the circuits have been connected between FIGS. 6a and 6b by lines a, b, c, d and e, to make a complete circuit. Also, the general circuit diagram has been set forth to effectuate a dotted outlining of the various portions of the circuit which correspond to those of the schematic shown in FIG. 5.

The frequency of the oscillator should be exactly matched to the transducer's resonant frequency, even as the resonant frequency changes during bonding. This is understandable in order to provide for optimum output of the transducer at the respective frequency that it is utilized.

In order to provide the foregoing, a limiter is shown with a phase detector and reactance modulator wherein all three act together as a feedback circuit to alter the oscillator's frequency in synchronism with changes in transducer resonant frequency. The foregoing provides the feature of a phase locked loop.

Looking more particularly at the oscillator, it can be seen that the oscillator operates continuously, in this case at approximately 60 kHz. The oscillator depends upon the value of L1, C29 and C31 connected in a Colpitts circuit. In this circuit, locl feedback sustains oscillation obtained by tapping the capacitor divider of the tank circuit shown therein. The base of the oscillator is bypassed to ground by C28. A pullup resistor R49 is shown which turns the oscillator on.

The emitter is held at a DC level by R43 and R44. The output of the foregoing oscillator is a well defined sine wave. Circuit loading is minimized by buffering the output with a Darlington connected emitter follower Q11.

To synchronize the oscillator's frequency with that of the transducer, a sample of the transducer current containing phase information is transformer coupled from R17. Transformers T1 and T2 isolate the transducer from ground within the generator. The sample is clipped by a limiter circuit before being applied to the phase detector.

Looking more particularly at FIGS. 6a and 6b, the limiter can be defined as seen within the general area dotted out and labeled limiter. In this particular instance the 60 kHz current sample is capacitively coupled to the limiter's input C21. Assuming that the AC input is instantaneously zero, 1ma flows through R34 and divides between the input diodes CR9 and CR10 and input diode CR7 and CR8. This flow recombines through R35. The input and output nodes are both at essentially the same potential, which is about 6 volts dc.

Assuming that the current sample now reaches its maximum positive value, for example, two volts (8 volts dc), as would be the case of the 4 volt peak-to-peak sine wave, CR8 and CR9 become back-biased. The input node is effectively disconnected from R34 causing current to follow the path through CR7, R18 and C14. This in turn produces a 0.1 volt drop across R18.

On the next half cycle, the negative 2 volt signal (4 volts dc) disconnects CR7 and CR10. The current flowing through R35 must be supplied through R18, C14 and CR8. The resulting 0.1 volt drop across R18 is of the opposite polarity. This circuit thus limits the transducer current sample voltage into the phase detector to 0.2 volts, regardless of the magnitude of the sample.

It can be seen that the phase detector U12 is of the quadrature type wherein the output is neutral or balanced when the oscillator sample is 90 degrees out of phase with the signal derived from the transducer. The phase detector i.c. is a dual differential amplifier.

The desired system operating condition is to have the transducer current and voltage in phase at the transducer, which is defined as resonance. Thus, the signal from the oscillator must be artificially shifted by R42 and C30, the required 90 degrees.

The phase detector is formed by cross connecting two differential amplifiers which have been labeled U12. One input is connected to the emitter transistor common to each pair of differentially connected transistors. The other input is cross-connected to the differential pairs. The result is that the voltage drop across the two output summing resistors R28 and R29 are equal when the two inputs are in phase quadrature, positive (R28 compared to R29) when the oscillator frequency is lower than the transducer resonance frequency, and negative when the oscillator frequency is higher.

The error signal derived from the phase detector contains a double frequency component that is filtered by C19, leaving a DC error signal whose magnitude is a function of the phase difference and whose sign is a function of relative frequency (above or below) with respect to that of the transducer.

The error signal is connected to a reactance modulator U15. U15 is a similarly connected dual differential amplifier in which a sample of the oscillator signal drives the common emitter transistors. The output of the reactance modulator is connected to the oscillator's tank circuit resulting in the injection of current into the tank. The injected current either leads or lags the phase of the circulating current in the tank, thereby correcting the oscillator's operating frequency and phase to match that of the transducer.

The power amplifier is labeled as such and has been dotted in the general configuration as indicated. The power amplifier is a conventional fixed gain complementary Darlington circuit. The fixed output signal level at the oscillator buffer is fed through a computer controlled attenuator, described hereinafter, which varies the signal level into the power amplifier and thus the resulting output level connected to the transducer. A positive going signal at the input to the amplifier is inverted twice by Q10 and Q8, turning Q5 on and Q6 off. The voltage at the output coupling capacitor C12 goes positive. A negative input signal turns Q10, Q8 and Q5 off and turns Q6 on as its base is driven negative by the current through R9.

Negative feedback is developed by coupling some of the output voltage back to the input through R20, R19 and Q9. Emitter coupling varies the current through Q10.

The output power is capacitively coupled through C12 to the transducer through output transformer Q1. The secondary of this transformer is center tapped and connected to the ground side of the transducer through current sampling resistor R17.

The parallel capacity of the transducer is neutralized by connecting an equivalent value capcitor C18 to the opposite leg of the output transformer secondary. A second transformer T2 provides complete dc isolation of the transducer from the generator while providing the transducer current sample required by the phase locked circuits and electronic touchdown sensor.

There are two operating modes; constant current and constant voltage.

In order to provide the signal level control during constant voltage operation the 60 khz signal from buffer amplifier Q11 is passed through a computer controlled attenuator comprised of a digital to analog converter (DAC) U8 prior to being amplified by the power amplifier. U8 is a part type AD7523.

R13 function as a full scale level set adjustment for the constant voltage mode. Inasmuch as the DAC is driven by inverting buffers, a hex FF (or hex FE) on the parallel data bus input attenuates the signal completely blocking the 60 kHz signal from the output power amplifier and transducer. The least significant bit is used for mode control and has no effect on generator level. A hex 01 (or 00) of the bus applies the entire 60 KHZ signal level to the power amplifier. Intermediate values on the data bus produce corresponding ultrasonic signal voltage levels at the output of the power amplifier.

Constant current operation on the other hand requires that the transducer current be sampled and an error signal developed when necessary to maintain transducer current at the value prescribed by the data bus. This requires a change in the generator's circuit configuration.

For constant transducer current operation, switches are set to their alternate state by raising the least significant bit of the data bus (D0). This causes pins 9, 10 and 11 of the digitally controlled analog switch U10 to reconnect the output pins 14, 15, and 4 from the constant voltage input pins 13, 1 and 3, to the constant current pins 12, 2, and 5. This switch mode can be seen within the switches which have been dotted in as showing a switch function, but which in reality are integrated circuit switches of an MC 14053.

In constant current mode, the DAC operates as a dc divider whose reference source is the five volt supply, adjusted by R12. This dc level is summed at U16 with the correction signal corresponding to changes in transducer current derived from a synchronous detector U11. U11 is a part No. MC3004. The output of the summing amplifier is used to modulate the transconductance of 60 kHz gain control amplifier U9 prior to the 60 kHz level being sent to the power amplifier.

Looking more particularly at the synchronous detector, it can be seen that it comprises means for the transducer current sample to be synchronously demodulated by U11, U14 and U16. U11 and the diodes associated therewith, namely, diode CR11 and CR12, detect a 60 kHz sample from T2 and charge C24 to the peak value. The detected peak level stored on C24 is transferred through U16 to C27 by turning U14a on. It is temporarily frozen at that level by turning transmission gate U14a off. Once frozen, U14b is turned on, permitting C24 to discharge somewhat prior to the next peak arriving.

The resulting error voltage is summed in one section of the quad JFET operational amplifier U16 as described earlier. Thus, the amplitude of the 60 kHz signal is instantaneously varied to maintain a constant output current in the transducer, even though the impedance of the transducer changes drastically during stitch bonding operations, as well as with regard to thick film circuits. Please keep in mind that the transducer as previously stated has its impedance modified as it moves with regard to thick film circuits and stitch bonding wherein substantial amounts of pressure are utilized.

Looking more particularly at the area labeled Touchdown Amplifier, it should also be noted tht this is part of the touchdown sensing circuit. The touchdown sensing is important to determine when the tools 162 or 180 have touched the work, so the tool lowering mechanism can be stopped. This is obtained by setting a low value on the data bus prior to touchdown causing the tool to vibrate at a low ultrasonic amplitude. The generator is set to constant voltage mode. Thus, as the tool is damped slightly by contact with the work surface, the decrease in transducer current sampled by R17 and T2 work their way through the synchronous detector U11 and U16. A decrease in level manifested by touchdown is amplified by two operational amplifiers in series, namely amplifiers U16. The U16 parts are designated as part types MC3004.

Potentiometer R48 sets the touchdown sensitivity level. It is adjusted to reliably set flip-flop U17 at low static loads.

The state of flip-flop U17 is monitored by the host computer during the touchdown period. The flip-flop U17 is reset when the mode select line is set to one. This autommtically occurs when the host sends a turnoff (Hex FF) signal to the generator.

An external or mechanical touchdown signal may be used in place of the ultrasonic touchdown sensor if desired. The synchronous detector output is buffered by U17 and available at J7 for use during testing.

The generator derives its power from the host bonder. Twenty-four volt dc is used by the power amplifier and regulated 16 volts is developed by CR3 for the DAC. Integrated circuit regulators connected in series supply +12 and +5 volts. Negative 1 and 5 volts are derived from series connected regulators whose source of negative voltage is a switch converter driven by the 60 kHz oscillator. Emitter coupled transistors drive a second pair of complementary transistors whose output is connected to a voltage doubler. This power is subsequently filtered prior to being regulated. The foregoing generally comprises the power supply which can be in any particular form but has taken the foregoing form as the embodiment for this particular circuit.

As can be seen from the foregoing description, this invention is a broad step over the art by providing a particularly useful ultrasonic bonding system with a unique ultrasonic generator. This will be seen as being covered by the following claims in reference thereto.

I claim:

1. A wire bonding device comprising:
   a wire bonding tool connected to a transducer which is driven by an oscillator and further comprising switch means to provide constant voltage or constant current from said oscillator to said transducer; and,
   a phase detector and reactance modulator connected between said transducer and said oscillator to control the output of said oscillator in response to the movement of said transducer.

2. The wire bonding device as claimed in claim 1 further comprising:
   a power amplifier interconnected between said oscillator and said transducer.

3. The wire bonding device as claimed in claim 2 further comprising:
   a synchronous detector for detecting a synchronous relationship of the movement of said transducer and tool for controlled movement and drive by said oscillator.

4. The wire bonding device as claimed in claim 3 further comprising:
   a digital to analog converter (DAC) driven by a host computer for providing the control of power from said oscillator to said transducer in response to a requirement for constant current or constant voltage to said transducer.

5. The wire bonding device as claimed in claim 4 further comprising:
   a strobe generator in connected relationship to said synchronous detector for maintaining constant voltage or constant current to said transducer.

6. An ultrasonic wire bonding apparatus having a generator for providing power to a transducer thereof comprising:
   an oscillator;
   means for providing constant current in one mode or constant voltage in another mode to said transducer;
   transducer coupling means between said transducer and said oscillator; and,
   a phase detector and reactance modulator for providing phased power to said transducer for resonance control thereof.

7. The apparatus as claimed in claim 6 further comprising:
   a constant current source and a constant voltage source to said transducer.

8. The apparatus as claimed in claim 6 further comprising:
   a power amplifier interconnected between said oscillator and said transducer for providing power thereto in response to a requirement for constant current or constant voltage.

9. The apparatus as claimed 6 further comprising:
   a digital to analog converter (DAC) interfaced between a host computer for controlling a constant current or constant voltage mode and said transducer.

* * * * *